(12) United States Patent
Deletraz

(10) Patent No.: US 6,882,225 B2
(45) Date of Patent: Apr. 19, 2005

(54) MULTI-STAGE POWER AMPLIFIER FOR AUDIO FREQUENCIES

(76) Inventor: Hervé Deletraz, 5, chemin des Halliers, CH - 1234 Vessy (CH)

( * ) Notice: Subject to any disclaimer, the term of this patent is extended or adjusted under 35 U.S.C. 154(b) by 0 days.

(21) Appl. No.: 10/495,209
(22) PCT Filed: Sep. 30, 2002
(86) PCT No.: PCT/CH02/00541
§ 371 (c)(1), (2), (4) Date: May 10, 2004
(87) PCT Pub. No.: WO03/043185
PCT Pub. Date: May 22, 2003

(65) Prior Publication Data
US 2004/0196101 A1 Oct. 7, 2004

(30) Foreign Application Priority Data
Nov. 15, 2001 (CH) .............................................. 2147/01

(51) Int. Cl.[7] .................................................. H03F 3/18
(52) U.S. Cl. ........................ 330/263; 330/267; 330/311
(58) Field of Search .................................. 330/262, 263, 330/267, 311

(56) References Cited

U.S. PATENT DOCUMENTS

| 4,216,437 | A | * | 8/1980 | Sakaida | 330/263 |
| 4,833,423 | A | | 5/1989 | Molloy | 330/265 |
| 5,512,859 | A | * | 4/1996 | Moraveji | 330/263 |
| 6,552,613 | B1 | * | 4/2003 | Murray et al. | 330/263 |

FOREIGN PATENT DOCUMENTS

EP   0 673 111   9/1995

* cited by examiner

Primary Examiner—Khanh V. Nguyen
(74) Attorney, Agent, or Firm—Ostrolenk, Faber, Gerb & Soffen, LLP

(57) ABSTRACT

The invention concerns a power amplifier consisting of three stages: a first feedback-free stage amplifying the input signal in current; a second stage amplifying in voltage the signal output from the first stage and comprising two direct current feedback half-circuits symmetrically implanted and operating over the whole frequency spectrum; a third feedback-free stage amplifying the current derived from the second stage and powering a loudspeaker.

5 Claims, 1 Drawing Sheet

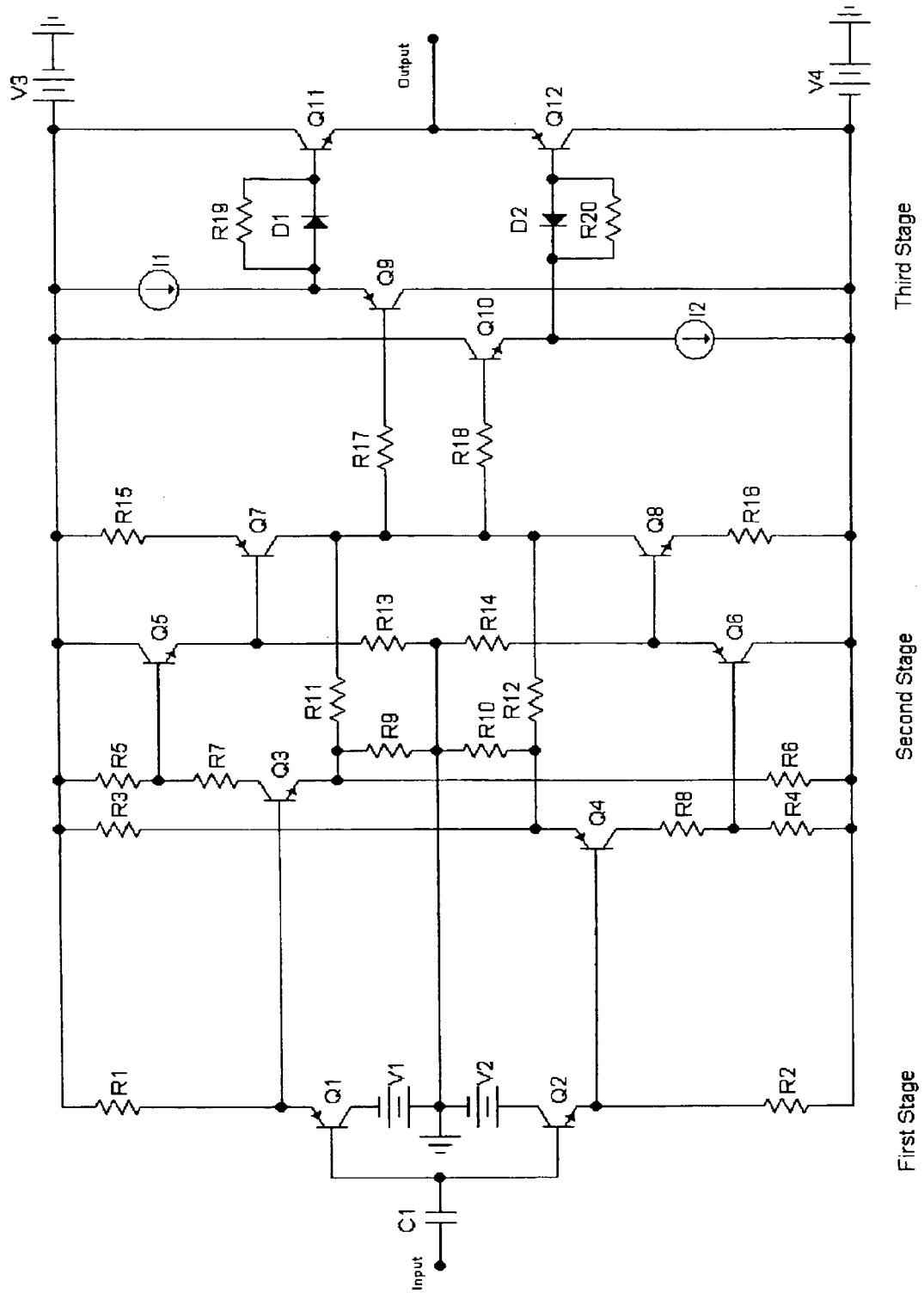

MULTI-STAGE POWER AMPLIFIER FOR AUDIO FREQUENCIES

FIELD OF THE INVENTION

The object of this invention is a hi-fi bipolar transistor power amplifier for audio frequencies.

SUMMARY OF THE INVENTION

This amplifier, which is disclosed in the application for this patent, can be used for a number of applications, particularly in information technology and the electronics industry. As such, it can be described as universal.

Its main characteristics are as follows:

Very broad bandwidth combined with negligible phase shift.

Reproduction of dynamic range exempt from transient distortion.

Linear group propagation delay over the whole frequency range.

High level of immunity vis-à-vis electrostatic phenomena.

Excellent reliability due to the small number of electronic components.

BRIEF DESCRIPTION OF THE DRAWING

The sole FIGURE in the appended drawing is the wiring diagram of a non-limitative embodiment of a power amplifier according to the invention. The amplifier represented is made up of three stages.

DETAILED DESCRIPTION OF THE PREFERRED EMBODIMENTS

The first stage comprises two symmetrical bipolar transistors biased to class A Q1 and Q2 and two resistors R1 and R2 used to set the input impedance at source. Its bandwidth is very broad. It operates in an open loop with low phase shift at a single pole. Its very low input capacitance allows for linear frequency response even with a high-impedance source.

The second stage comprises six bipolar transistors Q3, Q4, Q5, Q6, Q7, Q8 and resistors R3–R18.

Its voltage gain is determined by the two symmetrical direct-current negative feedback potential dividers formed by the resistors R9/R11 and R10/R12. The transistors Q3 and Q4 provide initial voltage amplification and are then buffered by the transistors Q5 and Q6. The signal power is then further amplified by the transistors Q7 and Q8 connected in common-collector mode.

In this second stage, the signal is therefore amplified successively as follows: one voltage amplification, one current amplification and one power amplification. This arrangement allows for the signal to be increased gradually to the level required by the following stage.

This second stage presents a linear open loop gain, a low output impedance and a high propagation velocity guaranteeing linear transient behaviour exempt from dynamic distortion.

The third stage comprises four transistors biased to class AB Q9, Q10, Q11, and Q12, two resistors R19 and R20 and two diodes D1 and D2.

The transistors Q9 and Q10, which are powered by a current source, cause a drop in voltage $V_{BE}$ at the terminals of the transistors Q11 and Q12 that is directly proportionate to the drop in voltage $V_{BE}$ at the terminals of the transistors Q9 and Q10.

The quiescent current passing through the transistors Q11 and Q12, generated by their voltage VBE, is therefore directly dependent on the voltage VBE of the transistors Q9 and Q10.

This circuit constitutes a simplification of the conventional bias circuit, thus improving the static and dynamic characteristics of this stage compared with the known analogous stages.

The resistors R19 and R20 are used to act directly on the working range (classes A, AB or B) depending on the type of application required.

The diodes D1 and D2 provide a very fast pulse response through their p-n junction capacitance and protect the resistors R19 and R20 against heating.

This third stage, which is a novel design in itself, is electrically and thermally stable and its very low output impedance allows for open loop operation.

The combination of these three stages allows for the production of power amplifiers with the following specific features and advantages:

assembly capacity adaptability to a variety of applications such as microphone amplifiers and low-noise phono amplifiers distortion-free operation over very wide voltage ranges repeatability of characteristics in mass production minimal test procedures availability of the electronic components ease of maintenance unrivalled attack reproduction dynamic range reproduced without compression high fidelity sound image.

The invention is obviously not limited to the diagram shown and the application described.

In particular, other applications may be envisaged, particularly due to the high speed of the circuit.

For example, in information technology, it can be used for the fast and reliable positioning of hard disk write heads. The very short settling time is obtained in this case without any parasitic oscillation, and the desired position is reached without error.

Miniaturisation of the circuit would make it even faster.

Also in information technology, its low output impedance means that it can be used to transmit data at high speeds over long distances. The standard distance (100 m) for hardwired links could thus be increased considerably.

In information technology and the electronics industry, it can be used, due to its high switching rate, in very high frequency switched mode power supplies.

Its high input impedance combined with a very low capacitance makes it very easy to control.

These applications are not exhaustive and any system requiring accuracy, high speed and/or immunity to external agents would benefit from this "universal" circuit.

What is claimed is:

1. Universal hi-fi bipolar transistor power amplifier for audio frequencies, characterised by the fact that it is made up of three stages:

a first stage devoid of negative feedback, amplifying the current of an input signal, a second stage amplifying the voltage of an output signal of the first stage and comprising two direct-current negative feedback potential dividers, implanted symmetrically and operating over an entire frequency spectrum, a third stage, devoid of negative feedback, amplifying the current from the second stage and used to power a speaker, the quiescent current of output transistors being produced by the base-emitter junction voltage of driver transistors.

2. Amplifier according to claim 1, characterised by the fact that its first stage comprises two symmetrical bipolar transistors biased to class A (Q1, Q2) and two resistors (R1, R2).

3. Amplifier according to claim 1, characterised by the fact that its second stage comprises six bipolar transistors (Q3 to Q8) and resistors (R3 to R18), with the negative feedback potential dividers comprising two pairs of symmetrical resistors (R9/R11 and R10/R12).

4. Amplifier according to claim 1, characterised by the fact that its third stage comprises four bipolar transistors biased to class AB (Q9, Q10, Q11, Q12) and two resistors (R19 and R20) used in particular to act on a working range.

5. Amplifier according to claim 4, characterised by the fact that its third stage comprises two diodes (D1, D2) protecting the resistors (R19, R20) and used to act on the working range against any heating.

* * * * *